(12) United States Patent
Tyborowski

(10) Patent No.: US 7,971,192 B2
(45) Date of Patent: Jun. 28, 2011

(54) METHOD, SYSTEM AND COMPUTER PROGRAM PRODUCT FOR ANALYSIS OF SIMULATION RESULTS

(75) Inventor: Mariusz Tyborowski, Toronto (CA)

(73) Assignee: International Business Machines Corporation, Armonk, NY (US)

( * ) Notice: Subject to any disclaimer, the term of this patent is extended or adjusted under 35 U.S.C. 154(b) by 1211 days.

(21) Appl. No.: 11/470,272

(22) Filed: Sep. 6, 2006

(65) Prior Publication Data

US 2008/0126069 A1    May 29, 2008

(51) Int. Cl.
*G06F 9/44*    (2006.01)
(52) U.S. Cl. ......... 717/130; 717/104; 717/128; 717/135
(58) Field of Classification Search .................. None
See application file for complete search history.

(56) References Cited

U.S. PATENT DOCUMENTS

| | | | | |
|---|---|---|---|---|
| 6,149,318 | A * | 11/2000 | Chase et al. | 717/131 |
| 6,968,540 | B2 * | 11/2005 | Beck et al. | 717/130 |
| 7,827,524 | B2 * | 11/2010 | Wilson et al. | 717/108 |
| 2002/0199172 | A1 * | 12/2002 | Bunnell | 717/128 |
| 2003/0056199 | A1 * | 3/2003 | Li et al. | 717/127 |
| 2004/0098707 | A1 * | 5/2004 | Tang et al. | 717/130 |
| 2004/0210877 | A1 * | 10/2004 | Sluiman et al. | 717/130 |
| 2004/0268317 | A1 * | 12/2004 | Gouriou et al. | 717/130 |
| 2005/0223368 | A1 * | 10/2005 | Smith et al. | 717/128 |
| 2006/0064335 | A1 * | 3/2006 | Goldszmidt et al. | 705/7 |
| 2006/0112122 | A1 * | 5/2006 | Goldszmidt et al. | 707/101 |
| 2007/0277151 | A1 * | 11/2007 | Brunel et al. | 717/113 |

OTHER PUBLICATIONS

CINSim Howto: Installation and User's Guide, Arvid Walter and Matthias Kuhm, Copyright 2004-2005 TU—Berlin, 91 pp.
Towards a Standard for Hierarchical Process Oriented Discrete Event Simulation Diagrams, R. J. Pooley, Transactions of The Society for Computer Simulation, Copyright 1991 The Society for Computer Simulation, vol. 8, No. 1, pp. 1-20.

* cited by examiner

*Primary Examiner* — Jason Mitchell
(74) *Attorney, Agent, or Firm* — Cantor Colburn LLP; Dermott Cooke

(57) ABSTRACT

A method of analyzing simulation results of a model, the method comprising: obtaining a process model including model elements including tasks, non-reusable sub-processes, and called reusable sub-processes; assigning a unique identifier to each model-element; generating unique model-element-proxies for all model-elements except for model elements corresponding to a model-reusable-sub-process or a model element contained by a model-reusable-sub-process; generating unique model-element-proxies for model-reusable-sub-processes and model-elements contained by model-reusable-sub-processes; associating each generated model-element-proxy with a corresponding model-element; executing simulation of the process model and persisting for each element instance data produced during simulation, the instance data including an element instance identifier and a corresponding model-element-proxy identifier; querying persisted simulation data for information using model-element-proxy identifiers.

5 Claims, 2 Drawing Sheets

METHOD, SYSTEM AND COMPUTER PROGRAM PRODUCT FOR ANALYSIS OF SIMULATION RESULTS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to computer simulation, and particularly to using model-element-proxies to facilitate efficient analysis of simulation results.

2. Description of Background

Computer simulation of processes is widespread. Existing products, such as the WebSphere Business Modeler from IBM, allow users to simulate business processes. In the WebSphere Business Modeler, business process is modeled as a collection of tasks, non-reusable sub-processes, and calls to reusable processes with a defined execution sequence specified by connections and control structures. Each of non-reusable sub-processes may, in turn, contain tasks, other non-reusable sub-processes, and calls to reusable processes. A reusable process can be called from multiple places in the main process, any of the main process' non-reusable sub-processes and any of the main process' called reusable processes.

To further describe process modeling done in WebSphere Business Modeler and similar products, reference is made to FIG. 1 where an exemplary model is depicted. The model includes a process P1 that includes a call to reusable sub-process P0 (later referred to as call-to-P0$i$). Tasks T1, T2 are implemented in process P1. Process P1 also includes sub-process P2, which includes another call to reusable sub-process P0 (later referred to as call-to-P0$j$). Tasks T3 and T4 are implemented in sub-process P2. Reusable sub-process P0 includes tasks Tx1, Tx2 and Tx3. Arrows connecting tasks/processes indicate flow of execution.

During simulation, when a given task/process is reached the instance of this task/process is created and then executed. To avoid ambiguity, elements defined in a business process (such as P1, P0, T3, T4, etc.) will be referred to as model-elements (model-tasks, model-processes), while elements created during simulation run will be referred to as element instances (task instances, process instances). Each task and process instance is uniquely identified by its own identifier, and contains a reference (such as model-element identifier) to its model-element.

When model-process P1 is simulated, two process instances of model-sub-process P0 are created (one created through call from P1 instance and one by a call from P2 instance), and corresponding task instances of model-tasks Tx1, Tx2, Tx3 are created in both P0 instances. Let's consider the example aggregated and percolated cost analysis report in Table 1 below. In this analysis each sub-process' cost is an aggregation of costs of all tasks and sub-processes it ultimately contains. In other words, cost is added across a sub-process level and then percolated up the containment hierarchy. It is important to notice there are two rows referring to P0 model-sub-process (as P0$i$, and P0$j$), each with an aggregated cost value corresponding to P0 model-sub-process instance owned by a different super-process (which later is referred as P0 in two different contexts). Accurately accounting for the costs of P0 process instances and the associated tasks instances is difficult. The difficulty arises in identifying whether P0 instance was created through a call from P1 instance or from P2 instance. (And similarly, in identifying whether Tx1, Tx2, Tx3 instances were instantiated in P0 process instance resulting from a call issued from P1 or P2 instance.) If aggregated and percolated cost analysis is performed on a single process instance, an algorithm simply traversing a containment tree should give acceptable performance. However, if analogous analysis is to be done for costs aggregated across multiple P1 instances, the traversing algorithm is going to perform very poorly. (Importantly, if RDBMS was to be used to persist simulation results, there is no simple, non-recursive SQL query that could produce the above analysis if for each task/process instance all that is given is its costs, its containment data, and information on its corresponding model-task/process.)

TABLE 1

| PROCESS/ TASK_NAME | AGGREGATED COST WITH REUSABLE PROCESSES CALCULATED IN CALLING CONTEXT |
|---|---|
| P1 | c_sum(T1) + c_sum(T2) + c_sum(P0i) + c_sum(P2) + c_sum(join) |
| T1 | c_sum(T1) |
| P0i | c_sum(Tx1i) + c_sum(Tx2i) + c_sum(Tx3i) |
| Tx1i | c_sum(Tx1i) |
| Tx2i | c_sum(Tx2i) |
| Tx3i | c_sum(Tx3i) |
| P2 | c_sum(T3) + c_sum(P0j) + c_sum(T4) |
| T3 | c_sum(T3) |
| P0j | c_sum(Tx1j) + c_sum(Tx2j) + c_sum(Tx3j) |
| Tx1j | c_sum(Tx1j) |
| Tx2j | c_sum(Tx2j) |
| Tx3j | c_sum(Tx3j) |
| T4 | c_sum(T4) |
| join | c_sum(join) |

[c_sum(X) = sum of all costs incurred on model-element x instances]

Similarly, execution path identification algorithm that uses only containment and model-element information associated with task/process instances must traverse run-time instance containment tree for each instance of reusable process (or any of its tasks) and thus cannot be very efficient.

Thus, there is a need in the art for a technique to efficiently identify context of task/process instance creation. Among others, this technique must allow for calculation of costs incurred within a reusable process instantiated in any context without the need to traverse main process instance containment tree.

SUMMARY OF THE INVENTION

The shortcomings of the prior art are overcome and additional advantages are provided through the provision of a method of analyzing simulation results of a model, the method comprising: obtaining a process model including model elements including tasks, non-reusable sub-processes, and called reusable sub-processes; assigning a unique identifier to each model-element; generating unique model-element-proxies for all model-elements except for model elements corresponding to a model-reusable-sub-process or a model element contained by a model-reusable-sub-process; generating unique model-element-proxies for model-reusable-sub-processes and model-elements contained by model-reusable-sub-processes; associating each generated model-element-proxy with a corresponding model-element;

executing simulation of the process model and persisting for each element instance data produced during simulation, the instance data including an element instance identifier and a corresponding model-element-proxy identifier; querying persisted simulation data for information using model-element-proxy identifiers.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which eliminates the need to traverse process instance containment tree for analyses that require information on task/process instance creation context. This solution provides means to efficiently calculate various costs and revenues incurred for instances of reusable processes instantiated in various calling contexts and to efficiently identify execution path taken in an overall process instance.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Embodiments of the invention relate to simulation of processes and analysis of simulation results. The simulation is typically executed on a general-purpose computer executing a computer program in response to code stored on a computer program product. The code includes instructions enabling the computer to perform the functions described herein.

The following illustrates some advantages of using model-element-proxies in the implementation where RDBMS is employed as a simulation results persistence mechanism with SQL used as a query language. The given example deals with calculation of aggregated cost values which is just one of possible applications. Conceptually, the same advantages (i.e., elimination of recursion or some expensive pre-processing) are to be realized regardless of persistence mechanism or query method.

Figure 1:
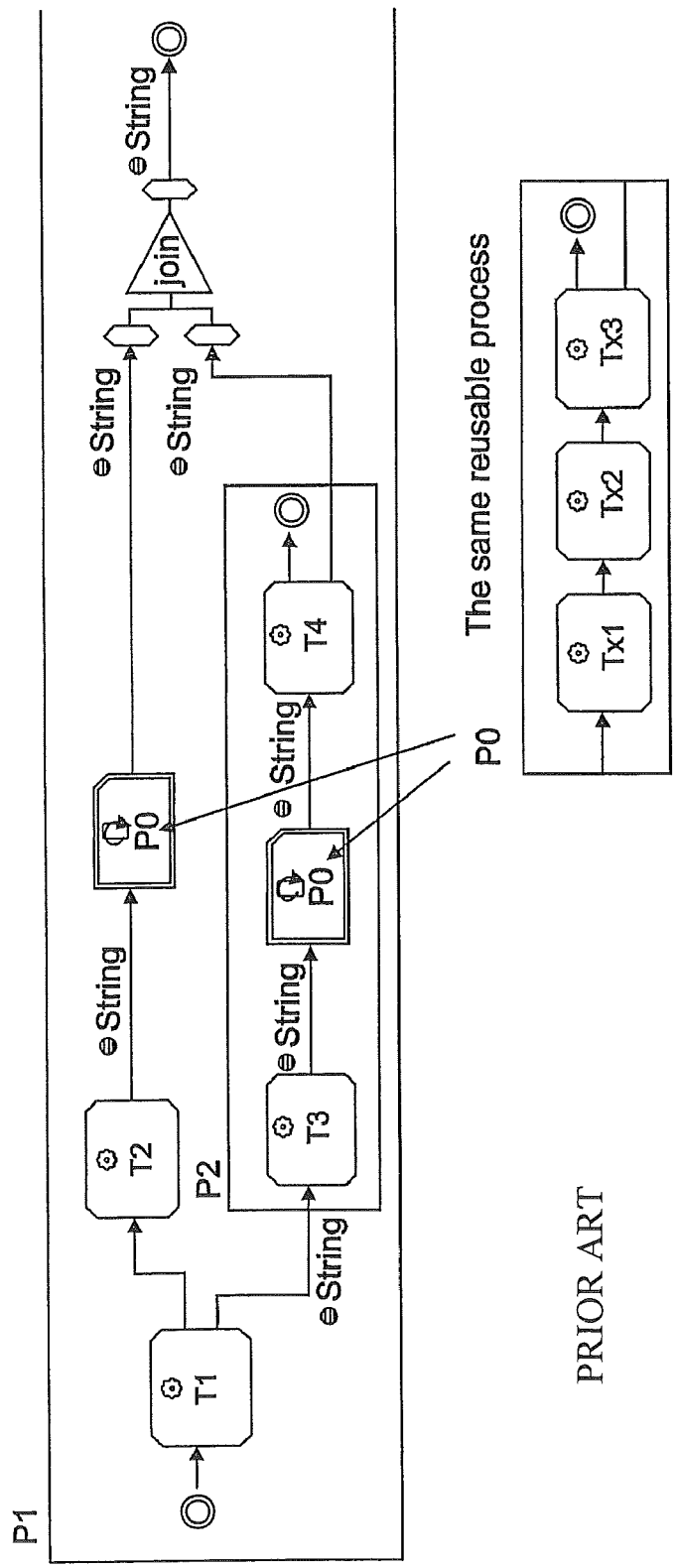
FIG. 1 illustrates one example of process to be simulated.

The following example illustrates the example's model structure without using a diagram. The containment hierarchy of the model of FIG. 1 may be represented as shown in Table 2, where indentation indicates containment of one task within another.

TABLE 2

P1
  T1
  T2
  call-to-P0i
  P2
    T3
    call-to-P0j
    T4
  join
P0
  Tx1
  Tx2
  Tx3

All model-tasks and model-processes must have unique identifiers assigned. Let's notice that P1 does not contain P0 directly; rather, it contains calling mechanisms (call-to-P0 under P1, and under P2) that refer to P0. If information about process model's model-tasks and model-processes is to be stored in RDBMS, it may be put into the MODEL table containing the following attributes: SIMULATION_ID which identifies the simulation run, TASK_NAME which contains the model-task name and MODEL_TASK_ID which uniquely identifies model-tasks. For the process model outlined above, entries in MODEL table might be as shown in Table 3 below.

TABLE 3

| SIMULATION_ID | TASK_NAME | MODEL_TASK_ID |
|---|---|---|
| 1 | P1 | 1 |
| 1 | T1 | 2 |
| 1 | T2 | 3 |
| 1 | call-to-P0i | 4 |
| 1 | P2 | 5 |
| 1 | T3 | 6 |
| 1 | call-to-P0j | 7 |
| 1 | T4 | 8 |
| 1 | join | 9 |
| 1 | P0 | 10 |
| 1 | Tx1 | 11 |
| 1 | Tx2 | 12 |
| 1 | Tx3 | 13 |

For the argument's sake let's assume that, on task instance termination, the simulation emits an event that contains the SIMULATION_ID which identifies the simulation run, PROCESS_ID which identifies the top process instance to which terminated task instance belongs, TASK_ID which uniquely identifies the task instance (assigned at run-time), MODEL_TASK_ID which identifies model-task corresponding to the task instance, PARENT_ID which identifies the instance of the process that contains the task, COST which specifies cost occurred on the task instance. It is understood that embodiments are not dependent on any particular mechanism of reporting instance specific simulation data (e.g., costs) as long as such a mechanism exists. For the process model outlined earlier, entries in a TERMINATION table that is used to store task instance termination attributes, referring to instances of model-task Tx1 are shown in Table 4 below.

TABLE 4

| SIMULATION_ID | PROCESS_ID | TASK_ID | MODEL_TASK_ID | PARENT_ID | COST |
|---|---|---|---|---|---|
| 1 | 1 | 6 | 11 | 5 | $1000 |
| 1 | 1 | 13 | 11 | 12 | $500 |
| 1 | 2 | 23 | 11 | 22 | $1000 |
| 1 | 2 | 30 | 11 | 29 | $500 |
| 1 | 3 | 40 | 11 | 39 | $1000 |
| 1 | 3 | 47 | 11 | 46 | $500 |
| 1 | 4 | 57 | 11 | 56 | $1000 |
| 1 | 4 | 64 | 11 | 63 | $500 |
| 1 | 5 | 74 | 11 | 73 | $1000 |
| 1 | 5 | 81 | 11 | 80 | $500 |

The table above illustrates data that may be recorded on termination event of model-task Tx1 instances. If a database query is used to calculate aggregated cost of all Tx1 model-task instances that belong to P0 instances regardless of how P0 instance was created, the query adds up the costs for entries in TERMINATION table where MODEL_TASK_ID=11. This is a routine database query. If there is a need to calculate aggregated cost of all instances of model-tasks Tx1 that belong to an instance of P0 model-process that was created by the call from an instance of P1 process-model (in the context P1/call-to-P0i/P0/Tx1), then for each event, its grand parent event (e.g., the event twice removed from the current event) must be checked for association with P1. For example, for each event referring to Tx1 model-task (MODEL_TASK_ID=11), the event that refers to its parent must be checked (by definition this parent event must refer to P0 model-process and thus its MODEL_TASK_ID=10) if its parent (and a grand parent of the initial event) in turn refers to call-to-P0i (that has MODEL_TASK_ID=4 and is associated with P1). Only then cost in the termination event referring to Tx1 model-task may be included in the P1/call-to-P0i/P0/Tx1 aggregated cost. In general, with events/tables defined as above, a simple SQL query that calculates aggregated cost value of a task instance contained in an instance of a reusable sub-process in the given context cannot be formulated. Either SQL query must use recursion or some expensive pre-processing must be done to determine the cost incurred in model-task Tx1 instances that resulted from a call issued from a model-process P1 instance.

To alleviate the problem of traversal of process instance containment tree to acquire information on task/process instance creation context, unique model-element-proxies are generated for all model-tasks and all model-non-reusable-sub-processes that are not contained in model-reusable-sub-processes; furthermore unique model-element-proxies are also generated for each context in which reusable sub-processes are used. Thus if process model contains two calls to the same model-reusable-process, then there are two proxies corresponding to the model-reusable-process itself, and to each of the model-tasks, model-non-reusable-processes it contains. For example, for P0 model-element there are two proxies created; one for P0 called from P1 (by call-to-P0i and listed under TASK_NAME as P0i) and the other for P0 called from P2 (by call-to-P0j and listed under TASK_NAME as P0j). Similarly, there are two proxies for each of Tx1, Tx2, Tx3 tasks that belong to P0.

For the example model outlined above, if model-element-proxies were to be stored in a PROXY table, entries in this table may be as shown in Table 5 below. MODEL_TASK_IDs are the same as those shown in Table 3. TASK_NAME column with indentation indicating containment was added to aid visualization. PROXY_TASK_IDs are defined as described in the preceding paragraph.

TABLE 5

| TASK_NAME | SIMULATION_ID | PROXY_TASK_ID | MODEL_TASK_ID |
|---|---|---|---|
| P1 | 1 | 1 | 1 |
| T1 | 1 | 2 | 2 |
| T2 | 1 | 3 | 3 |
| call-to-P0i | 1 | 4 | 4 |
|   P0i | 1 | 5 | 10 |
|     Tx1i | 1 | 6 | 11 |
|     Tx2i | 1 | 7 | 12 |
|     Tx3i | 1 | 8 | 13 |
| P2 | 1 | 9 | 5 |
| T3 | 1 | 10 | 6 |
| call-to-P0i | 1 | 11 | 7 |
|   P0j | 1 | 12 | 10 |
|     Tx1j | 1 | 13 | 11 |
|     Tx2j | 1 | 14 | 12 |
|     Tx3j | 1 | 15 | 13 |
| T4 | 1 | 16 | 8 |
| join | 1 | 17 | 9 |

Figure 2:
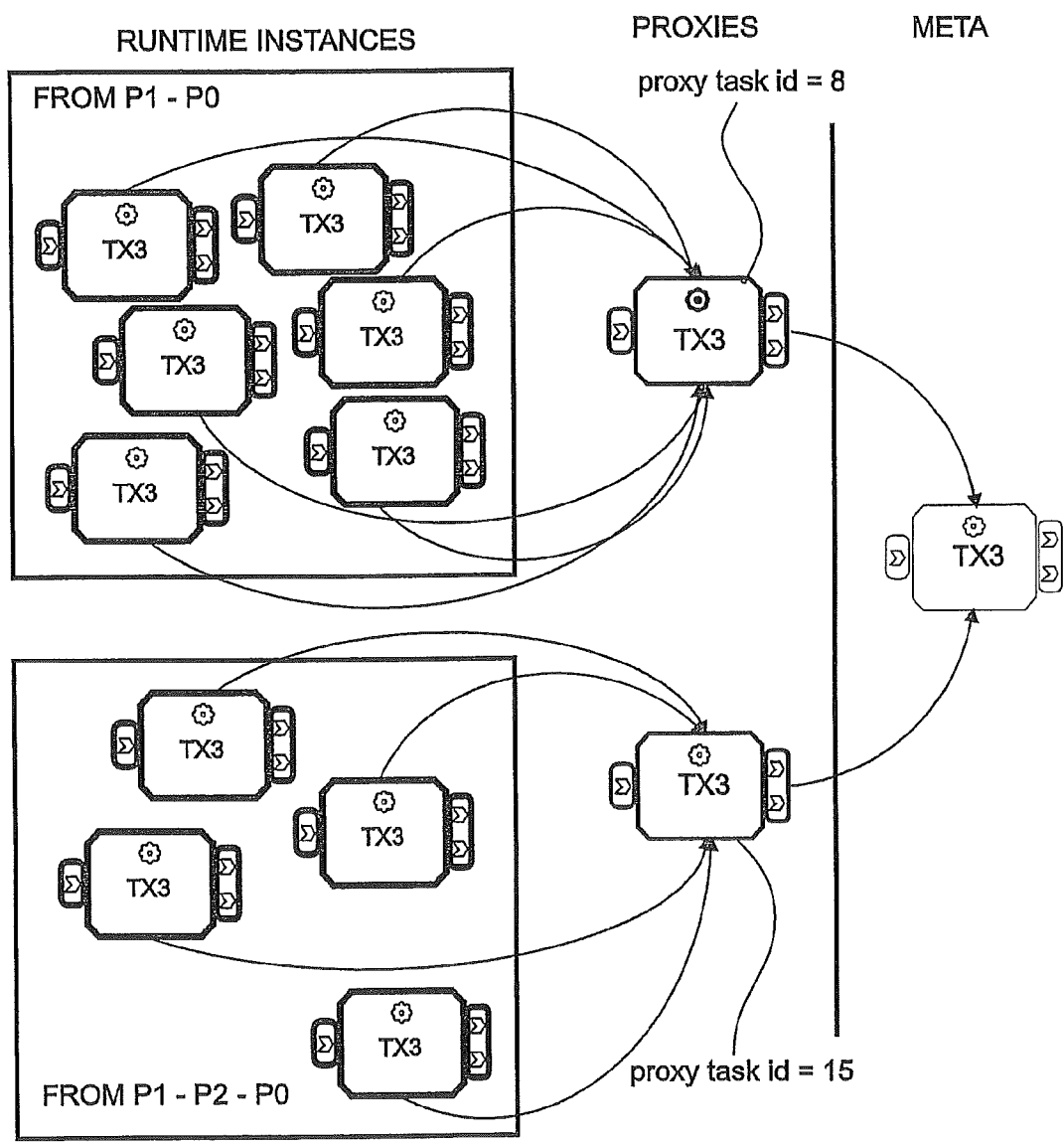
FIG. 2 illustrates one example of how element instances relate to model-element-proxies and how model-element-proxies, in turn, relate to model-elements.

FIG. 2 illustrates how element instances relate to model-element-proxies and how model-element-proxies, in turn, relate to model-elements. Tx3 model-task, its model-element-proxies and its instances are depicted in FIG. 2 for sake of illustration, but it is understood that all model-elements contained in the process model may be assigned model-element-proxies Entries in the revised TERMINATION table referring to instances of model-task Tx1 from the process model outlined above, are shown below in Table 6. For the invention to work simulation engine must be aware of and able to report which proxy-meta-element corresponds to a given instance, which must be the case if the revised TERMINATION table is to be populated as show below.

TABLE 6

| SIMULATION_ID | PROCESS_ID | TASK_ID | PROXY_TASK_ID | PARENT_ID | COST |
| --- | --- | --- | --- | --- | --- |
| 1 | 1 | 6 | 6 | 5 | $1000 |
| 1 | 1 | 13 | 13 | 12 | $500 |
| 1 | 2 | 23 | 6 | 22 | $1000 |
| 1 | 2 | 30 | 13 | 29 | $500 |
| 1 | 3 | 40 | 6 | 39 | $1000 |
| 1 | 3 | 47 | 13 | 46 | $500 |
| 1 | 4 | 57 | 6 | 56 | $1000 |
| 1 | 4 | 64 | 13 | 63 | $500 |
| 1 | 5 | 74 | 6 | 73 | $1000 |
| 1 | 5 | 81 | 13 | 80 | $500 |

If a database query (e.g., SQL) is used to calculate aggregated cost of all Tx1 task instances that belong to P0 instances regardless of the context in which P0 was created, all that is needed is to add up all cost in a table resulting from a join of the PROXY table (Table 5) and the revised TERMINATION table (Table 6) on PROXY_TASK_ID and specify MODEL_TASK_ID=11 in the where clause. As the model task identifier is 11 for both model tasks Tx1$i$ and Tx1$j$, this query provides the total cost for all calls to task Tx1.

If a database query is needed to determine the aggregated cost of all Tx1 task instances that belong to P0 instances that were created through a call directly from P1 (in the context P1/call-to-P0$i$/P0/Tx1), then knowing that PROXY_TASK_ID=6 represents context P1/call-to-P0$i$/P0/Tx1, a query needs only to add up costs in all events containing PROXY_TASK_ID=6. There is no need for recursion in SQL or some other expensive processing.

Thus, model-element-proxies generated for model-tasks and processes allow for very significant performance improvement and much simpler algorithm design for any aggregated analysis analogous to cost analysis described above.

In alternate embodiments, input/output model-element-proxies may be used in developing more efficient and simpler set of algorithms dealing with identification of execution paths, critical/shortest path analyses, etc.

The embodiments described above are independent of any particular method of persistence or analysis. For example, model-element-proxies can simplify processing and improve performance regardless whether XML-to-flat-file or RDBMS is used for persistence, and whether XPath or plain SQL or java with SQL, or other techniques, are used for implementation of analysis algorithms.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of analyzing simulation results of a model, the method comprising:
obtaining a process model including model elements including tasks, non-reusable sub-processes, and called reusable sub-processes;
assigning a unique identifier to each model-element;
generating unique model-element-proxies for all model-elements except for model elements corresponding to a model-reusable-sub-process or a model element contained by a model-reusable-sub-process,
generating unique model-element-proxies for each context in which model-reusable-sub-processes and model-elements contained by model-reusable-sub-processes are used,
associating each generated model-element-proxy with a corresponding model-element;
executing simulation of the process model and persisting for each element instance data produced during simulation, the instance data including an element instance identifier and a corresponding model-element-proxy identifier;
querying persisted simulation data for information using model-element-proxy identifiers.

2. The method of claim 1 wherein querying persisted simulation data includes querying using both model-element-proxy identifiers and model-element identifiers.

3. The method of claim 1 wherein the model elements include model-task, model-non-reusable-sub-process, model-reusable-sub-process, model-call-to-reusable-sub-process, model-task-input and model-task-output.

4. The method of claim 1 wherein querying persisted simulation data includes querying the simulation data to determine a cost associated with model-reusable-sub-processes and model-elements contained by model-reusable-sub-processes.

5. The method of 4 wherein the cost is an aggregated and percolated cost analysis report.

* * * * *